United States Patent
Palles-Dimmock et al.

(10) Patent No.: US 10,388,902 B1
(45) Date of Patent: Aug. 20, 2019

(54) STRUCTURE FOR A HIGH RESOLUTION LIGHT-EMITTING DEVICE

(71) Applicant: Sharp Kabushiki Kaisha, Osaka (JP)

(72) Inventors: James Andrew Robert Palles-Dimmock, Oxford (GB); Edward Andrew Boardman, Abingdon (GB); Tim Michael Smeeton, Oxford (GB); Enrico Angioni, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/937,046

(22) Filed: Mar. 27, 2018

(51) Int. Cl.
*H01L 51/50* (2006.01)
*H01L 51/52* (2006.01)
*H01L 51/56* (2006.01)
*H01L 51/00* (2006.01)
*H01L 27/32* (2006.01)

(52) U.S. Cl.
CPC ........ *H01L 51/502* (2013.01); *H01L 27/3211* (2013.01); *H01L 51/0017* (2013.01); *H01L 51/5004* (2013.01); *H01L 51/5056* (2013.01); *H01L 51/5072* (2013.01); *H01L 51/5225* (2013.01); *H01L 51/5278* (2013.01); *H01L 51/56* (2013.01); *H01L 2251/552* (2013.01)

(58) Field of Classification Search
None
See application file for complete search history.

(56) References Cited

U.S. PATENT DOCUMENTS 7,569,248 B2   8/2009  Jang et al.
8,344,615 B2   1/2013  Chae et al.
9,525,148 B2   12/2016 Kazlas et al.
2011/0057561 A1* 3/2011 Chae ............... B82Y 20/00
                                              313/504

OTHER PUBLICATIONS

Choi et al., Wearable red-green-blue quantum dot light-emitting diode array using high-resolution intaglio transfer printing, Nature Communications, pp. 1-8, May 2015.
Bae et al., Multicolored Light-Emitting Diodes Based on All-Quantum-Dot Multilayer Films Using Layer-by-Layer Assembly Method, Nano Letters, pp. 2368-2373, May 2010.
Liu et al., All-quantum-dot emission tuning and multicolored optical films using layer-by-layer assembly method, Chemical Engineering Journal 324, pp. 19-25 (2017).

* cited by examiner

*Primary Examiner* — Bo B Jang
(74) *Attorney, Agent, or Firm* — Renner, Otto, Boissellle & Sklar LLP

(57) ABSTRACT

A device includes a first light-emitting device and a second light-emitting device, each including an anode, a cathode, charge transport layers disposed between the anode and the cathode, and an emissive layer disposed between the charge transport layers. For the first light-emitting device, the emissive layer includes first quantum dots, the emissive layer configured to emit light at a first wavelength. For the second light-emitting device, the emissive layer includes emissive sub-layers provided in a stacked arrangement in a thickness direction. A first one of the emissive sub-layers includes the first quantum dots and is configured to emit light at the first wavelength, and a second one of the emissive sub-layers includes second quantum dots and is configured to emit light at a second wavelength different than the first wavelength.

19 Claims, 7 Drawing Sheets

STRUCTURE FOR A HIGH RESOLUTION LIGHT-EMITTING DEVICE

TECHNICAL FIELD

The invention relates to light-emitting devices, and in particular light-emitting devices including solution processable emitting layers such as quantum dot LEDs. These light-emitting devices may be implemented in display applications, for example high resolution, multicolor displays. The invention further relates to methods of manufacturing said light-emitting devices.

BACKGROUND ART

A common architecture for a light-emitting device includes an anode and cathode; an emissive layer (EML) containing a material which emits light upon electron and hole recombination, such as an inorganic or organic semiconductor layer or layer of quantum dots (QDs); at least one hole transporting layer (HTL) between the anode and the emissive layer providing transport of holes from the anode and injection of holes into the emissive layer; and at least one electron transporting layer (ETL) between the cathode and the emissive layer providing transport of electrons from the cathode and injection of electrons into the emissive layer. U.S. Pat. No. 9,525,148 (Kazlas et al., issued Dec. 20, 2016), discloses a light-emitting device including such an architecture.

When the emissive layer includes an organic material, the light-emitting device is referred to as an organic light emitting diode (OLED). When the emissive material includes nanoparticles, sometimes known as quantum dots (QDs), the device is commonly called either a quantum dot light emitting diode (QLED, QD-LED) or an electroluminescent quantum dot light emitting diode (ELQLED).

Current methods of patterning QLEDS into regions or subpixels (e.g., on a substrate) include various printing and stamping methods (e.g., inkjet, offset lithography, gravure, screen-printing, nano-imprinting, and dip coating). The QLEDS patterned into these regions or subpixels may be different respective QDs such that they emit (through electrical injection, i.e., by electroluminescence) different respective colors (e.g., red (R), green (G), and blue (B)). Sub-pixels that respectively emit red, green, or blue light may collectively form a pixel, which in-turn may be a part of an array of pixels of the display.

However, there remains an issue of the ability to provide a cost effective, high-resolution display. For example, generally there is a significant trade-off between speed and resolution, with currently industrially available printing techniques generally being fast (>~1 m$^2$/s) only if the resolution is poor (>100 um pitch).

U.S. Pat. No. 7,569,248 (Jang et al., issued Aug. 4, 2009) discloses a process to build a multilayer stack of nanocrystals via a series of UV curing steps on individual monolayers, but without reference to different colored regions.

U.S. Pat. No. 8,344,615 (Chae et al., issued on Jan. 1, 2013) discloses a device structure to achieve patterning of differently colored emitting regions by means of hydrophilic interlayers.

Choi et al., *Wearable red-green-blue quantum dot light-emitting diode array using high-resolution intaglio transfer printing*, Nature Communications, pages 1-8, May 2015 discloses that stacking and patterning different colors or types of QDs can be achieved in a layer-by-layer method such as transfer printing. Bae et al., *Multicolored Light-Emitting Diodes Based on All-Quantum-Dot Multilayer Films Using Layer-by-Layer Assembly Method*, Nano Letters, pages 2368-2373 and Liu et al., *All-quantum-dot emission tuning and multicolored optical films using layer-by-layer assembly method*, Chemical Engineering Journal 324, pages 19-25 (2017) disclose that stacking and patterning different colors or types of QDs can be achieved in a layer-by-layer method by using QD layers with alternately charged capping groups. However, such methods are slow, as they can only build the emissive layer one QD monolayer at a time.

Bae et al., *Multicolored Light-Emitting Diodes Based on All-Quantum-Dot Multilayer Films Using Layer-by-Layer Assembly Method*, Nano Letters, pages 2368-2373 also discloses that light emission preferentially occurs in the first monolayer from the limiting injection layer (either electron transfer layer or hole transfer layer).

CITATION LIST

U.S. Pat. No. 9,525,148 (Kazlas et al., issued Dec. 20, 2016).
U.S. Pat. No. 7,569,248 (Jang et al., issued Aug. 4, 2009).
U.S. Pat. No. 8,344,615 (Chae et al., issued on Jan. 1, 2013).
Choi et al., *Wearable red-green-blue quantum dot light-emitting diode array using high-resolution intaglio transfer printing*, Nature Communications, pages 1-8, May 2015.
Bae et al., *Multicolored Light-Emitting Diodes Based on All-Quantum-Dot Multilayer Films Using Layer-by-Layer Assembly Method*, Nano Letters, pages 2368-2373.
Liu et al., *All-quantum-dot emission tuning and multicolored optical films using layer-by-layer assembly method*, Chemical Engineering Journal 324, pages 19-25 (2017).

SUMMARY OF INVENTION

The embodiments of the present disclosure may provide high-resolution patterns of light-emitting devices having different respective configurations of emissive regions, which are capable of producing different colors (e.g. RGB). Exemplary fabrication methods are disclosed which may provide the high-resolution patterning of these light-emitting devices.

The light-emitting devices produced in accordance with the present disclosure may possess one or more improved and/or advantageous properties. For example, the production processes described herein may allow for creation of a high resolution structure (e.g., a high-resolution display). In some embodiments, the production process also allows for the cavity between the respective emissive layers of the light-emitting devices and the reflective electrode to be tuned without changing the thickness of the charge transfer layer. The structure of the produced light-emitting devices also allows substantially single colored emission from a multilayer stack of emissive layers which individually would emit at different wavelengths. Placing the narrowest band gap material adjacent to the limiting charge transport layer, and in a cascade of progressively narrower band gap emissive layers may be advantageous because it is energetically favorable for recombination to occur in the lowest band gap material, and the gradual reduction in band gap from the widest band gap EML to the narrowest may facilitate charge transfer in this direction. This band gap narrowing, combined with placing the narrowest band gap adjacent to the limiting charge transport layer, may result in radiative recombination substantially coming from the narrowest band gap emissive layer in the layer stack. Having the layering in the disclosed order, with the narrowest band gap emissive layer adjacent to the limiting charge transport layer, also may provide the advantage that the emission from the narrowest band gap QDs will not excite carriers in adjacent (wider band gap) emissive layers. In this way little or no photoluminescence will be emitted from other emissive layers and the emitted light from each region will be substantially of a single color.

In accordance with one aspect of the present disclosure, a device includes: a first light-emitting device, the first light emitting device including: an anode; a cathode; charge transport layers disposed between the anode and the cathode; and an emissive layer disposed between the charge transport layers, the emissive layer including first quantum dots, the emissive layer configured to emit light at a first wavelength upon radiative recombination of holes and electrons therein; and a second light-emitting device, the second light-emitting device including: an anode; a cathode; charge transport layers disposed between the anode and the cathode; and an emissive layer disposed between the charge transport layers, the emissive layer including emissive sub-layers, a first one of the emissive sub-layers including the first quantum dots, the first one of the emissive sub-layers configured to emit light at the first wavelength upon radiative recombination of holes and electrons therein, a second one of the emissive sub-layers including second quantum dots, the second one of the emissive sub-layers configured to emit light at a second wavelength different than the first wavelength upon radiative recombination of holes and electrons therein, the first sub-layer and the second sub-layer provided in a stacked arrangement in a thickness direction between the anode and the cathode.

In some embodiments, the first wavelength and the second wavelength are separated by more than 40 nm.

In some embodiments, the first light-emitting device is configured to emit light of a single color corresponding to the first wavelength; and the second light-emitting device is configured to emit light of a single color corresponding to the second wavelength.

In some embodiments, the charge transport layers of the respective light-emitting devices include a hole transport layer proximate the anode and an electron transport layer proximate the cathode.

In some embodiments, the charge transport layers are common to the light-emitting devices.

In some embodiments, the hole transport layer is a limiting charge transfer layer having a hole mobility lower than the electron mobility of the electron transport layer; the second one of the emissive sub-layers of the second light-emitting device has a narrower band gap than the first sub-layer of the second light-emitting device; and the second one of the emissive sub-layers of the second light-emitting device is located closer to the hole transport layer than the first one of the emissive sub-layers.

In some embodiments, the electron transport layer is a limiting charge transfer layer having an electron mobility lower than the hole mobility of the hole transport layer; the second one of the emissive sub-layers of the second light-emitting device has a narrower band gap than the first sub-layer of the second light-emitting device; and the second one of the emissive sub-layers of the second light-emitting device is located closer to the electron transport layer than the first one of the emissive sub-layers.

In some embodiments, the device further includes a third light-emitting device, the third light-emitting device including: an anode; a cathode; charge transport layers disposed between the anode and the cathode; and an emissive layer disposed between the charge transport layers, the emissive layer including emissive sub-layers, a first one of the emissive sub-layers including the first quantum dots, the first one of the emissive sub-layers configured to emit light at the first wavelength upon radiative recombination of holes and electrons therein, a second one of the emissive sub-layers including second quantum dots, the second one of the emissive sub-layers configured to emit light at the second wavelength different than the first wavelength upon radiative recombination of holes and electrons therein, a third one of the emissive sub-layers including third quantum dots, the third one of the emissive sub-layers configured to emit light at a third wavelength different than the first wavelength and different from the second wavelength upon radiative recombination of holes and electrons therein, the first sub-layer, the second sub-layer, and the third sub-layer provided in a stacked arrangement in a thickness direction between the anode and the cathode.

In some embodiments, the first wavelength, the second wavelength, and the third wavelength are each separated by more than 40 nm.

In some embodiments, the first light-emitting device is configured to emit light of a single color corresponding to the first wavelength; the second light-emitting device is configured to emit light of a single color corresponding to the second wavelength; and the third light-emitting device is configured to emit light of a single color corresponding to the third wavelength.

In some embodiments, the first wavelength is within the range of 400 nm-490 nm, the second wavelength is within the range of 500 nm-590 nm, and the third wavelength is within the range of 600 nm-700 nm.

In some embodiments, the charge transport layers of the respective light-emitting devices include a hole transport layer proximate the anode and an electron transport layer proximate the cathode.

In some embodiments, the charge transport layers are common to the light-emitting devices.

In some embodiments, the hole transport layer is a limiting charge transfer layer having a hole mobility lower than the electron mobility of the electron transport layer; for the second light-emitting device: the second one of the emissive sub-layers of the second light-emitting device has a narrower band gap than the first sub-layer of the second light-emitting device; and the second one of the emissive sub-layers of the second light-emitting device is located closer to the hole transport layer than the first one of the emissive sub-layers; and for the third light-emitting device: the second one of the emissive sub-layers of the third light-emitting device has a narrower band gap than the first sub-layer of the third light-emitting device; the third one of the emissive sub-layers of the third light-emitting device has a narrower band gap than the second sub-layer of the third light-emitting device; and the third one of the emissive sub-layers of the second light-emitting device is located closer to the hole transport layer than the first one and second one of the emissive sub-layers.

In some embodiments, the electron transport layer is a limiting charge transfer layer having an electron mobility lower than the hole mobility of the hole transport layer; for the second light-emitting device: the second one of the emissive sub-layers of the second light-emitting device has a narrower band gap than the first sub-layer of the second light-emitting device; and the second one of the emissive sub-layers of the second light-emitting device is located closer to the electron transport layer than the first one of the emissive sub-layers; and for the third light-emitting device:

the second one of the emissive sub-layers of the third light-emitting device has a narrower band gap than the first sub-layer of the third light-emitting device; the third one of the emissive sub-layers of the third light-emitting device has a narrower band gap than the second sub-layer of the third light-emitting device; and the third one of the emissive sub-layers of the second light-emitting device is located closer to the electron transport layer than the first one and second one of the emissive sub-layers.

In some embodiments, the cathodes of the respective light-emitting devices are a part of a common cathode that is common to the light-emitting devices.

In accordance with another aspect of the present disclosure, a method of forming emissive layers of light-emitting devices includes: forming a first emissive layer on a charge transport layer, the first emissive layer including first quantum dots; selectively removing one or more areas of the first emissive layer using a patterned stamp such that one or more regions of the charge transport layer includes the first emissive layer thereon and one or more other regions of the charge transport layer does not include the first emissive layer thereon; and forming a second emissive layer on the charge transport layer and on the first emissive layer, the second emissive layer including second quantum dots different from the first quantum dots.

In some embodiments, the method further includes selectively removing one or more areas of the second emissive layer using a second patterned stamp such that the first emissive material includes a portion of the second emissive material layer thereon, one or more regions of the charge transport layer includes the second emissive layer thereon, and one or more other regions of the charge transport layer is exposed such that it does not include the second emissive layer or the first emissive layer thereon; and forming a third emissive layer on the charge transport layer and the second emissive layer, the third emissive layer including third quantum dots different from the first quantum dots and the second quantum dots.

In some embodiments, the method further includes depositing an additional charge transport layer on the emissive layers.

In accordance with another aspect of the disclosure, a method of forming emissive layers of light-emitting devices includes: forming a first photoresist on one or more regions of a charge transport layer; forming a second photoresist on the first photoresist and on one or more additional regions of the charge transport layer; forming a first emissive layer on the second photoresist and on or more exposed regions of the charge transport layer, the first emissive layer including first quantum dots; removing the second photoresist layer, the removal exposing the one or more additional regions of the charge transport layer and exposing the first photoresist, the removal also removing a portion of the first emissive layer that was deposited on the second photoresist layer; forming a second emissive layer on the one or more additional regions of the charge transport layer and on the first photoresist and the remaining portion of the first emissive layer, the second emissive layer including second quantum dots different from the first quantum dots.

In some embodiments, the method further includes removing the first photoresist layer, the removal exposing the one or more regions of the charge transport layer, the removal also removing a portion of the second emissive layer that was deposited on the second photoresist layer; and forming a third emissive layer on the one or more regions of the charge transport layer and on the second emissive layer, the third emissive layer including third quantum dots different from the first quantum dots and the second quantum dots.

In some embodiments, the method further includes depositing an additional charge transport layer on the emissive layers.

The foregoing and other features of the invention are hereinafter described in greater detail with reference to the accompanying drawings.

DESCRIPTION

Figure 1:
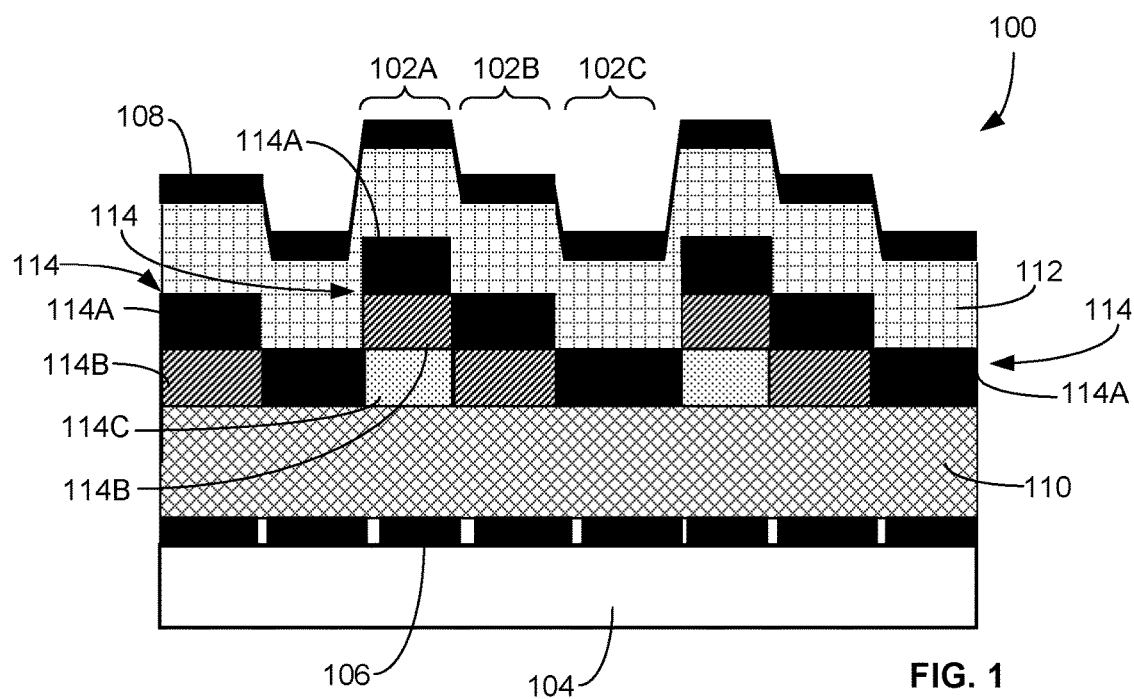
FIG. 1 is a schematic cross-section view showing an exemplary device including light-emitting devices, in accordance with the present disclosure.

Referring now to the drawings in detail and initially to FIG. 1, an exemplary device including multiple light-emitting devices is indicated generally by reference numeral 100. As shown, the device 100 includes different configurations of light-emitting devices 102A, 102B, 102C. The light-emitting devices 102A, 102B, 102C differ from one another with respect to their specific configurations of their emissive layers 114, which are described in more detail below. In some embodiments, the device 100 is a display device in which groups of the light-emitting devices are arranged in pixel and/or sub-pixel arrangements. The display device may be, for example, a high resolution, multicolor display. It will be appreciated that while the exemplary embodiment shown includes three different types of light-emitting devices, in other embodiments, the device may include more (e.g., 4, 5, 6, etc.) or fewer (e.g., 2) types of light-emitting devices. Furthermore, as exemplified in FIG. 1, it will be appreciated that the device may include multiple instances of each of the respective light-emitting devices 102A, 102B, 102C. Moreover, it will be appreciated that in other embodiments the manner in which the different types of light-emitting devices are arranged may be different.

The device includes a substrate 104 on which the light-emitting devices are arranged. The substrate 104 may be made from any suitable material(s). Exemplary substrates include glass substrates and polymer substrates. More specific examples of substrate material(s) include polyimides, polyethenes, polyethylenes, polyesters, polycarbonates, polyethersulfones, polypropylenes, and/or polyether ether ketones. The substrate 104 may be any suitable shape and size. As exemplified in FIG. 1, in some embodiments, the dimensions of the substrate allow for more than one light-emitting device to be provided thereon. In an example, a major surface of the substrate may provide an area for multiple light-emitting devices to be formed as sub-pixels of a pixel. In another example, a major surface of the substrate may provide an area for multiple pixels to be formed thereon, each pixel including a sub-pixel arrangement of light-emitting devices.

For each light-emitting device 102A, 102B, 102C, a stack of layers is provided on the substrate 104. The stack of layers includes electrodes 106, 108; charge transport layers 110, 112 disposed between the electrodes; and one or more emissive layers 114 disposed between the electrodes. In some embodiments, such as the one shown in FIG. 1, the stack is formed such that the electrode 106 proximate the substrate is an anode and the electrode 108 distal the substrate is a cathode. In such embodiments, the charge transport layer 110 between the anode and emissive layer may be a hole transport layer configured to provide transport of holes from the anode and injection of holes into the emissive layer; and the charge transport layer 112 between the cathode and emissive layer may be an electron transport layer configured to provide transport of electrons from the cathode and injection of electrons into the emissive layer. Accordingly, in the illustrated embodiment, for each light-emitting device, the order of the layers moving away from the substrate 104 is an anode 106, hole transport layer 110, emissive layer 114 including a single layer or two or more sub-layers, electron transport layer 112, and cathode 108. Although not specifically shown, in other embodiments, the layers may be stacked on the substrate in reverse order such that the cathode is proximate the substrate.

The electrodes 106, 108 may be made from any suitable material(s). In some embodiments, at least one of the electrodes is a transparent or semi-transparent electrode (e.g., partially reflective). In some embodiments, at least one of the electrodes is a reflective electrode. In some embodiments, one of the electrodes is a transparent or semi-transparent electrode and the other electrode is a reflective electrode. Exemplary electrode materials include one or more metals (e.g., aluminum, gold, silver, platinum, magnesium and the like and alloys thereof) or metal oxides (e.g., indium tin oxide, indium-doped zinc oxide (IZO), fluorine doped tin oxide (FTO), aluminum-doped zinc-oxide (AZO), indium-doped cadmium-oxide, and the like). In some embodiments, the thickness of the transparent or semi-transparent electrode may be 30 nm or thinner. One specific example of a semi-transparent (e.g., partially reflective) electrode is an Ag layer thinner than 30 nm. Another specific example of a semi-transparent (e.g., partially reflective) electrode is an Mg:Ag alloy layer thinner than 30 nm. One specific example of a reflective electrode is an Al layer thicker than 30 nm. Another specific example of a reflective electrode is an Ag layer thicker than 30 nm. Another specific example of a reflective electrode is a Ca/Al bilayer thicker than 30 nm. The electrodes 106, 108 may also be provided in any suitable arrangement. As an example, the electrodes 106, 108 may address a thin-film transistor (TFT) circuit. As exemplified in FIG. 1, the anode electrodes 106 of the respective light-emitting devices may be embodied as individual electrodes, and the cathode electrode 108 may be embodied as a common electrode among the light-emitting devices. Depending on the configurations of the electrodes, the device may be provided as a "bottom-emitting" structure or a "top-emitting" structure. Specific exemplary examples of these types of emitting structures are described below with respect to FIGS. 9 and 10.

The hole transport layer 110 may include a single layer or two or more sub-layers configured to transport holes therethrough from the anode electrode 106 to the emissive layer 114. The hole transport layer 106 may be made from any suitable material(s). In some embodiments, such as that shown in FIG. 1, the hole transport layer 110 may be provided as a common layer that is shared among the light-emitting devices. In other embodiments (exemplified by FIGS. 11 and 12, the hole transport layer 110 may be embodied as individual segments, each associated with a respective one of the light-emitting devices. In some embodiments, the hole transport layer 110 may include one or more of poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N, N'-bis(4-butylphenyl)-N, N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), and N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC). In embodiments where the hole transport layer 110 includes two or more sub-layers, the material(s) of one of the respective sub-layers may differ from the material(s) of one or more of the other sub-layers(s).

The electron transport layer 112 may include one or more layers configured to transport electrons therethrough from the cathode electrode 108 to the emissive layer 114. In some embodiments, such as that shown in FIG. 1, the electron transport layer 112 may be provided as a common layer that is shared among the light-emitting devices. In other embodiments (exemplified by FIGS. 11 and 12, the electron transport layer 112 may be embodied as individual segments, each associated with a respective one of the light-emitting devices. The electron transport layer 112 may be made from any suitable material(s). In some embodiments, the electron transport layer 112 may include one or more of ZnO, 8-quinolinolato lithium (Liq.), LiF, $Cs_2CO_3$, $Mg_xZn_{1-x}O$ where $0 \le x \le 1$, $Al_xZn_{1-x}O$ where $0 \le x \le 1$, 2,2',2''-(1,3,5-benzinetriyl)-tris(1-phenyl-1-H-benzimidazole) (TPBi), $TiO_2$, $ZrO_2$, N4,N4'-Di(naphthalen-1-yl)-N4,N4'-bis(4-vinylphenyl)biphenyl-4,4'-diamine (VNPB), and 9,9-Bis[4-[(4-ethenylphenyl)methoxy]phenyl]-N2,N7-di-1-naphthalenyl-N2, N7-diphenyl-9H-Fluorene-2,7-diamine (VB-FNPD). In embodiments where the electron transport layer 112 includes two or more sub-layers, the material(s) of one of the respective sub-layers may differ from the material(s) of one or more of the other sub-layers(s).

The emissive layer 114 includes a single layer or two or more sub-layers. With reference to FIG. 1, the emissive layer 114 of light-emitting device 102A includes three sub-layers 114A, 114B, 114C. The emissive layer 114 of light-emitting device 102B includes two sub-layers 114A, 114B. The emissive layer 114 of light-emitting device 102C includes one layer 114A. Each layer 114A, 114B, 114C includes quantum dots (QDs).

The one or more emissive layers 114 (114A, 114B, 114C) include quantum dots (QDs). In some embodiments, the one or more emissive layers include only QDs. In other embodiments, one or more of the emissive layers may include a conductive matrix. The conductive matrix may hold and/or disperse the QDs, and may improve charge transport and/or the physical robustness of the layer. Exemplary QDs 204 include one or more of: InP, CdSe, CdS, $CdSe_xS_{1-x}$, CdTe, $Cd_xZn_{1-x}Se$, $Cd_xZn_{1-x}Se_ySi_{1-y}$, ZnSe, ZnS, ZnSTe, ZnSeTe, perovskites of the form $ABX_3$, $Zn_wCu_zIn_{1-(w+z)}S$, and carbon, where 0≤w, x, y, z≤1 and (w+z)≤1. The QDs 204 may be embodied as nanoparticles. Exemplary conductive materials which can be mixed with the QDs to form the emissive layer include one or more of: 4,4'-Bis(N-carbazolyl)-1,1'-biphenyl (CBP), poly(9-vinylcarbazole) (PVK) or poly(N, N'-bis(4-butylphenyl)-N,N'-bisphenylbenzidine) (PolyTPD)

In some embodiments, the one or more emissive layers 114 (114A, 114B, 114C) may be crosslinked. Such crosslinking may be performed within a given layer and/or between two or more of the layers 114A, 114B, 114C. In some implementations, the QDs include ligands. The ligands may assist in crosslinking of the QDs within the layer. The ligands may be provided on the outer surface of the QDs. As an example, the quantum dots may include a core, a shell around the core, and ligands around the shell. In other embodiments, the quantum dots may include a core, a shell around the core, an oxide layer (e.g. an $Al_2O_3$ layer or a layer of another suitable metal oxide), and ligands around the oxide layer. Exemplary ligands include functional groups such as thiols, alkenes, alkynes, carbonyl and/or carboxyl functional groups.

The types of QDs used in the respective layers 114A, 114B, 114C may be different from one another. As such, the different layers 114A, 114B, 114C may be capable of emitting different respective wavelengths of light. In some embodiments, the different respective wavelengths of light may be separated in wavelength by more than 40 nm. In an example, layer 114A may be configured such that the QDs therein are capable of emitting blue light (wavelength 400 nm-490 nm); layer 114B may be configured such that the QDs therein are capable of emitting green light (500 nm-590 nm); and layer 114C may be configured such that the QDs therein are capable of emitting red light (600 nm-700 nm). Of course, in other embodiments, the respective colors of light emitted from layers 114A, 114B, 114C may be other suitable colors.

In embodiments of the light-emitting device wherein the emissive layer 114 includes two or more sub-layers (e.g., 102A and 102B), the sub-layers may be stacked on top of one another in the thickness direction. For example, FIG. 1 shows an exemplary embodiment of light-emitting device 102A where sub-layer 114A is proximate the cathode electrode 108; sub-layer 114C is proximate the anode electrode 106; and sub-layer 114B is disposed between the sub-layers 114A and 114C. FIG. 1 also shows an exemplary embodiment of light-emitting device 1026 where sub-layer 114A is proximate the cathode electrode 108; and sub-layer 1146 is proximate the anode electrode 106.

In some embodiments, the light-emitting devices may include one or more additional layers. Examples includes one or more injection layers (e.g., hole injection layer, electron injection layer). Exemplary materials suitable for use in a hole injection layer include, but are not limited to, poly(3,4-ethylenedioxythiophene) polystyrene sulfonate (PEDOT:PSS), $MoO_3$:PEDOT:PSS; $V_2O_5$, $WO_3$, $MoO_3$, 2,3,5,6-tetrafluoro-7,7,8,8-tetracyanoquinodimethane (F4TCNQ), and/or 1,4,5,8,9,11-hexaazatriphenylenehexac-arbonitrile (HATCN). Exemplary materials suitable for use in an electron injection layer include, but are not limited to, 8-quinolinolato lithium (Liq), LiF, and/or $Cs_2CO_3$.

Although not shown in FIG. 1, circuitry may also be coupled to the respective electrodes. The circuitry may be configured to drive the respective light-emitting devices (e.g., independently). In one example, the circuitry may include TFT circuitry. Circuitry coupled to the respective electrodes is schematically exemplified in embodiments shown in FIGS. 7G, 8G, and 9-12.

With continued reference to FIG. 1, the hole transport layer 110 and the electron transport layer 112 may be configured such that one is the limiting charge transfer layer. As defined herein, the limiting charge transport layer is the layer with the lower mobility for the charge the layer is configured to transport. In some embodiments, the difference in mobility between the charge transport layers (e.g., the mobility gap) may be ten times or more. For example, if the electron mobility in the electron transport layer is $10^{-3}$ $cm^2/Vs$ (the limiting charge transport layer in this example), the hole mobility of the hole transport layer may be greater than $10^{-2}$ $cm^2/Vs$. This may be the case for an electron transport layer of ZnO (~$10^{-4}$-$10^{-3}$ $cm^2/Vs$ depending on conditions) and a hole transport layer of TFB ($10^{-2}$ $cm^2/Vs$). In general, the greater the difference, the more likely the recombination will happen at or near the interface of the limiting charge transport layer and the emissive layer, rather than in the bulk.

For example, if the mobility of electrons in the electron transport layer 112 is lower than the mobility of holes in the hole transport layer 110, then the electron transport layer 112 is the limiting charge transport layer. As another example, if the mobility of holes in the hole transport layer 110 is lower than the mobility of electrons in the electron transport layer 112, then the hole transport layer 110 is the limiting charge transport layer. Radiative recombination in the emissive layer 114 takes place primarily near the interface between the emissive layer 114 and the limiting charge transport layer. Accordingly, even if the emissive layer 114 includes two or more sub-layers (such as that shown in FIG. 1) that are respectively configured to emit light of different colors, radiative recombination and emission may only or primarily occur in the sub-layer proximate the limiting charge transport layer. Therefore, emission from each light-emitting device 102A, 102B, 102C is substantially of a single color, even though the light-emitting device may include more than one emissive sub-layer, the sub-layers configured to emit different spectrum light. For example, light-emitting device 102A may be configured to emit light of a single color corresponding to the wavelength of light emitted by the QDs of the emissive sub-layer that is proximate the limiting charge transfer layer, even though the emissive layer includes other sub-layers including QDs that emit light of a different wavelength. Light emitting device 102B may be configured to emit light of a single color corresponding to the wavelength of light emitted by the QDs of the emissive sub-layer that is proximate the limiting charge transfer layer, even though the emissive layer includes another sub-layer including QDs that emit light of a different wavelength.

In one example, and with reference to FIG. 1, the light-emitting device 102A includes an emissive layer 114 having sub-layers 114A, 114B, 114C. If layer 114A is configured to emit blue light, layer 114B is configured to emit green light, and layer 114C is configured to emit red light; and if the hole transport layer 110 is the limiting charge transport layer, radiative recombination and emission may only or primarily occur in the sub-layer 114C proximate the hole transport layer (limiting charge transport layer) such that red light is emitted. Similarly, layer 114A is configured to emit blue light, layer 114B is configured to emit green light, and layer 114C is configured to emit red light; and if the electron transport layer 112 is the limiting charge transport layer, radiative recombination and emission may only or primarily occur in the sub-layer 114A proximate the electron transport layer (limiting charge transport layer) such that blue light is emitted.

In the embodiments described herein, and in accordance with the above-described selectivity of emission based on the limiting charge transport layer, the configuration and arrangement of the sub-layers 114A, 114B, 114C in the respective light-emitting devices may be provided such that the light-emitting devices emit different respective colors of light. For example, in an embodiment of FIG. 1 where layer 114A is configured to emit blue light, layer 114B is configured to emit green light, and layer 114C is configured to emit red light; and the hole transport layer is the limiting charge transport layer, the light-emitting device 102A may emit red light, the light-emitting device 102B may emit green light, and the light-emitting device 102C may emit blue light.

In some embodiments, the sub-layers of the emissive layer may be configured such that the lowest band gap emissive sub-layer is closest to the limiting charge transport layer. This may aid in providing substantially single-colored emission from recombination adjacent to the limiting charge transport layer. This may be advantageous because it may be energetically favorable for recombination to occur in the lowest band gap material, and the gradual reduction in band gap from the widest band gap emissive sub-layer to the narrowest band gap may facilitate charge transfer in this direction. This band gap narrowing, combined with placing the narrowest band gap adjacent to the limiting charge transport layer, may result in radiative recombination substantially coming from the narrowest band gap emissive sub-layer in the layer stack. Having the layering in this order, with the narrowest band gap emissive sub-layer adjacent to the limiting charge transport layer, also may provide the advantage that the emission from the narrowest band gap QDs will not excite carriers in adjacent (wider band gap) emissive layers. In this way, little or no photoluminescence may be emitted from other emissive layers and the emitted light from each region may be only or substantially of a single color.

Figure 2:
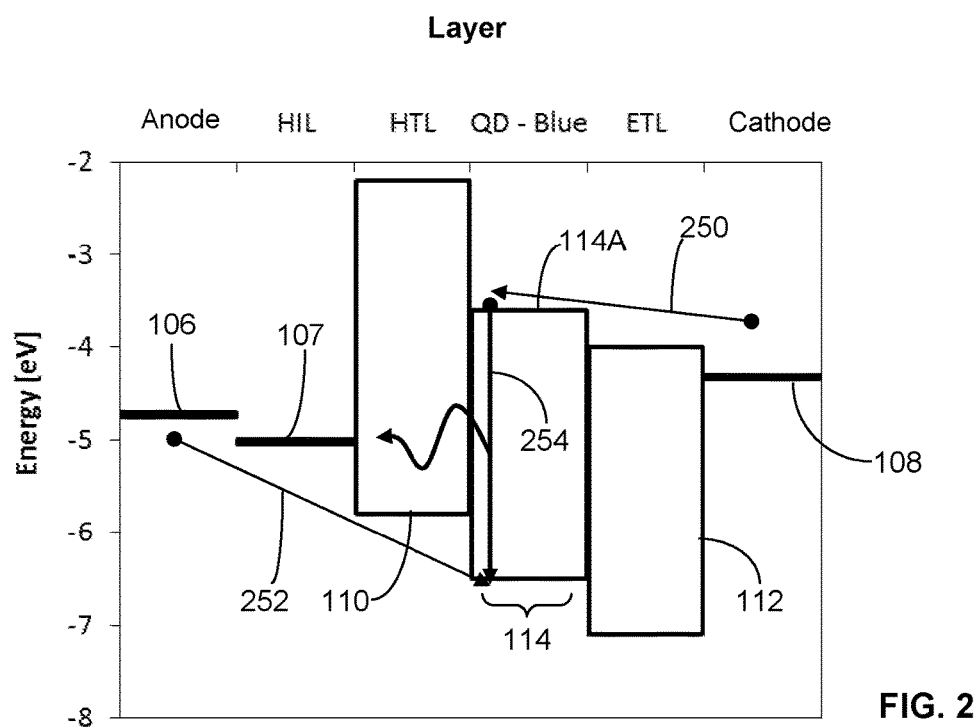
FIGS. 2-6 are energy diagrams of exemplary embodiments of light-emitting devices produced in accordance with the present disclosure.

FIG. 2 shows an exemplary band structure of a light-emitting device similar to 102C, which includes an emissive layer 114 that is a single layer 114A. The light emitting device is similar to light-emitting device 102C shown in FIG. 1, but additionally includes a hole injection layer 107 disposed between the anode electrode 106 and the hole transport layer 110. In the exemplary embodiment, layer 114A is configured to emit blue light. As such, in some embodiments, the light emitting device may be provided as a blue pixel (or sub-pixel), e.g., in a display device. As shown in FIG. 2, electrons are injected from the cathode 108 and are transported through the electron transport layer 112 to the emissive layer 114A (as indicated by arrow 250) where they recombine radiatively (as indicated by arrow 254) with a hole that is injected from the anode 106 and is transferred to the emissive layer 114A through the hole transport layer 110 (as indicated by arrow 252). Such recombination and emission of blue light occurs proximate the interface emissive layer 114A and the hole transport layer 110, which is the limiting charge transport layer.

Figure 3:
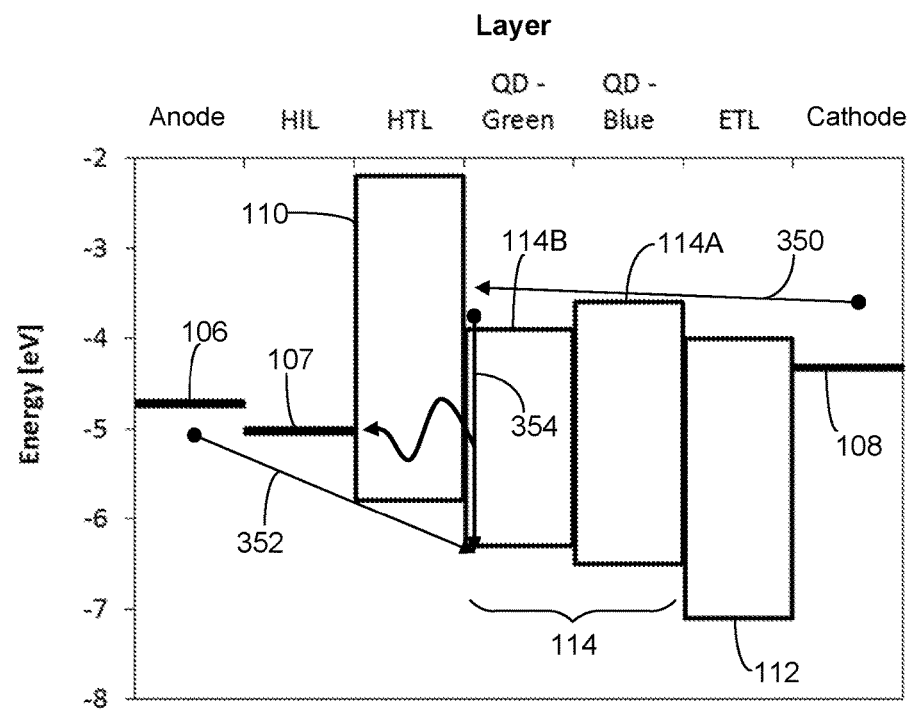

FIG. 3 shows an exemplary band structure of a light-emitting device similar to 102B, which includes an emissive layer 114 including sub-layers 114A and 114B. The light-emitting device is similar to the light-emitting device 102B shown in FIG. 1, but additionally includes a hole injection layer 107 disposed between the anode electrode 106 and the hole transport layer 110. In the exemplary embodiment, layer 114A is configured to emit blue light and layer 114B is configured to emit green light. The hole transport layer 110 is configured as the limiting charge transport layer. As such, in some embodiments, the light emitting device may be provided as a green pixel (or sub-pixel), e.g., in a display device. In the exemplified embodiment, the blue light emitting layer 114A has a wider band gap than the band gap of the green light emitting layer 114B. As shown in FIG. 3, electrons are injected from the cathode 108 and are transported through the electron transport layer 112 to the emissive layer 114 (as indicated by arrow 350). The electrons transfer through the blue light emissive sub-layer 114A because few or no injected holes are present in this layer for them to recombine with. Holes are injected from the anode 106 and are transferred to the emissive layer 114B through the hole transport layer 110 (as indicated by arrow 352), where they recombine radiatively (as indicated by arrow 354) with the electrons. Such recombination and emission of light occurs proximate the interface of the emissive layer 114B and the hole transport layer 110, which is the limiting charge transport layer. This gives emission primarily from the green QDs proximate the interface of the hole transport layer 110 and emissive layer 114B, which may result in single colored emission (e.g., green light).

Figure 4:
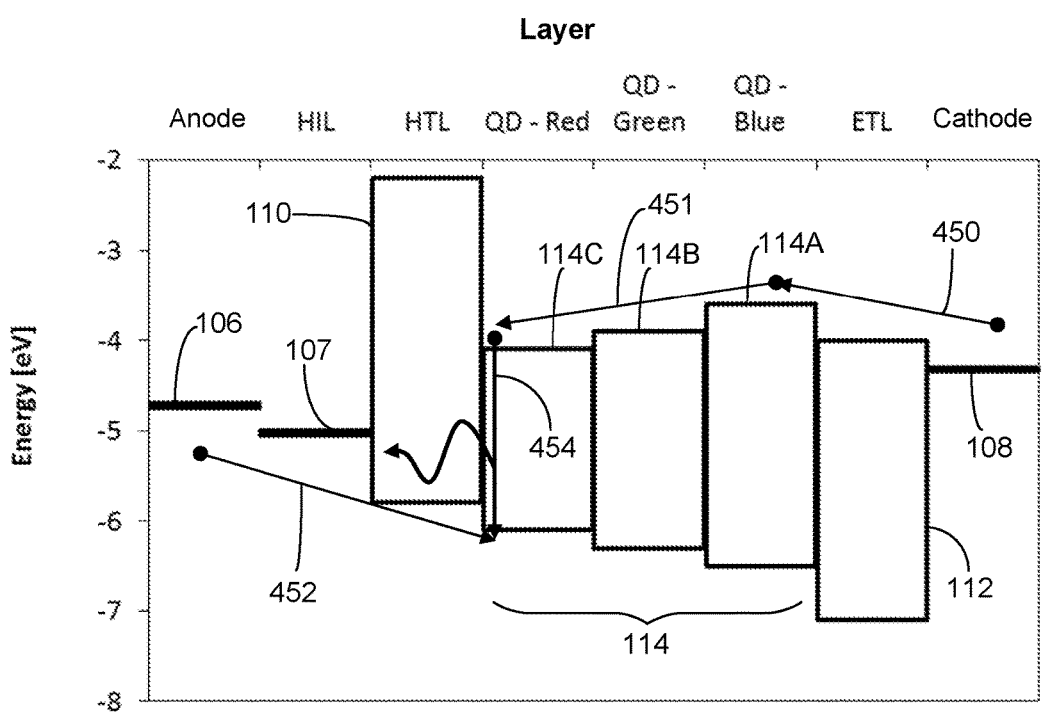

FIG. 4 shows an exemplary band structure of a light-emitting device similar to 102A, which includes an emissive layer 114 including sub-layers 114A, 114B, and 114C. The light-emitting device is similar to the light-emitting device 102A shown in FIG. 1, but additionally includes a hole injection layer 107 disposed between the anode electrode 106 and the hole transport layer 110. In the exemplary embodiment, layer 114A is configured to emit blue light, layer 114B is configured to emit green light, and layer 114C is configured to emit red light. The hole transport layer 110 is configured as the limiting charge transport layer. As such, in some embodiments, the light emitting device may be provided as a red pixel (or sub-pixel), e.g., in a display device. In the exemplified embodiment, the blue light emitting layer 114A has a wider band gap than the band gap of the green light emitting layer 114B, and the green light emitting layer 114B has a wider band gap than the band gap of the red light emitting layer 114C. As shown in FIG. 4, electrons are injected from the cathode 108 and are transported through the electron transport layer 112 to the emissive layer 114 (as indicated by arrows 450 and 451). The electrons transfer through the blue light emissive sub-layer 114A and through the green light emissive sub-layer 114B because few or no injected holes are present in these layers for them to recombine with. Holes are injected from the anode 106 and are transferred to the emissive layer 114C through the hole transport layer 110 (as indicated by arrow 452), where they recombine radiatively (as indicated by arrow 454) with the electrons. Such recombination and emission of light occurs proximate the interface of the emissive layer 114C and the hole transport layer 110, which is the limiting charge transport layer. This gives emission primarily from the red QDs proximate the interface of the hole transport layer 110 and emissive layer 114C, which may result in single colored emission (e.g., red light).

Figure 5:
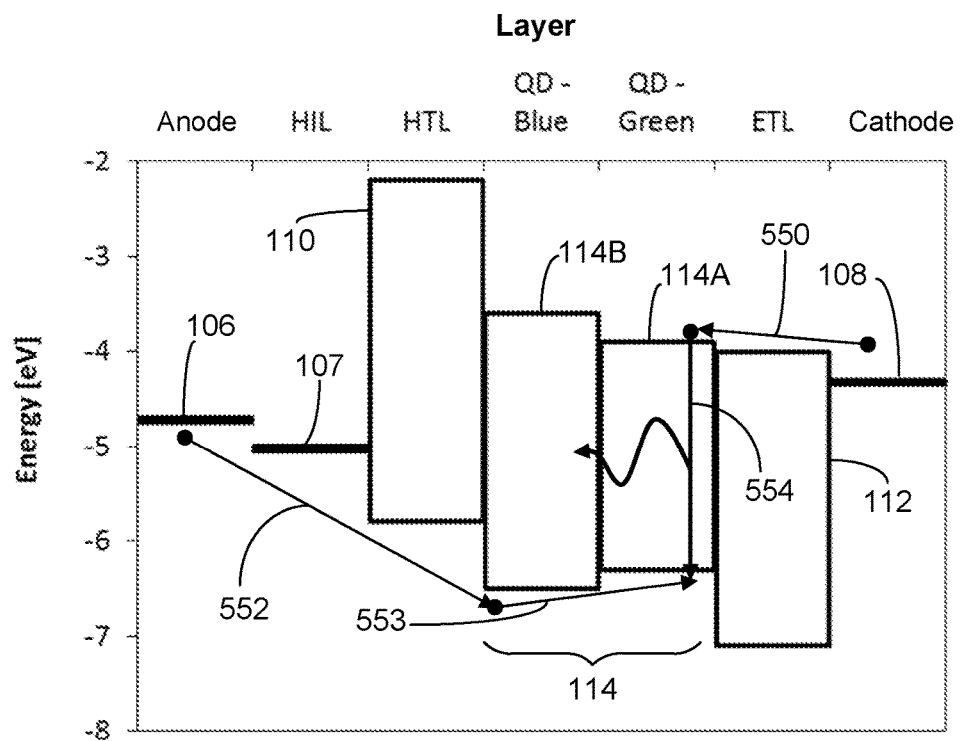

FIG. 5 shows an exemplary band structure of a light-emitting device similar to 102B, which includes an emissive layer 114 including sub-layers 114A and 114B. The light-emitting device is similar to the light-emitting device 102B shown in FIG. 1, but additionally includes a hole injection layer 107 disposed between the anode electrode 106 and the hole transport layer 110. Furthermore, as contrasted with the band structure shown in FIG. 3, the electron transport layer 112 is configured as the limiting charge transport layer. In the exemplary embodiment, layer 114A is configured to emit green light and layer 114B is configured to blue green light. As such, in some embodiments, the light emitting device may be provided as a green pixel (or sub-pixel), e.g., in a display device. In the exemplified embodiment, the blue light emitting layer 114B has a wider band gap than the band gap of the green light emitting layer 114A. As shown in FIG. 5, electrons are injected from the cathode 108 and are transported through the electron transport layer 112 to the emissive layer 114A (as indicated by arrow 550). Holes are injected from the anode 106 and are transferred to the emissive layer 114A through the hole transport layer 110 (as indicated by arrows 552 and 553). The holes transfer through the blue light emissive sub-layer 114B because few or no injected electrons are present in this layer for them to recombine with. The holes recombine radiatively (as indicated by arrow 554) with the electrons. Such recombination and emission of light occurs proximate the interface of the emissive layer 114A and the electron transport layer 112, which is the limiting charge transport layer. This gives emission primarily from the green QDs proximate the interface of the electron transport layer 112 and emissive layer 114A, which may result in single colored emission (e.g., green light).

Figure 6:
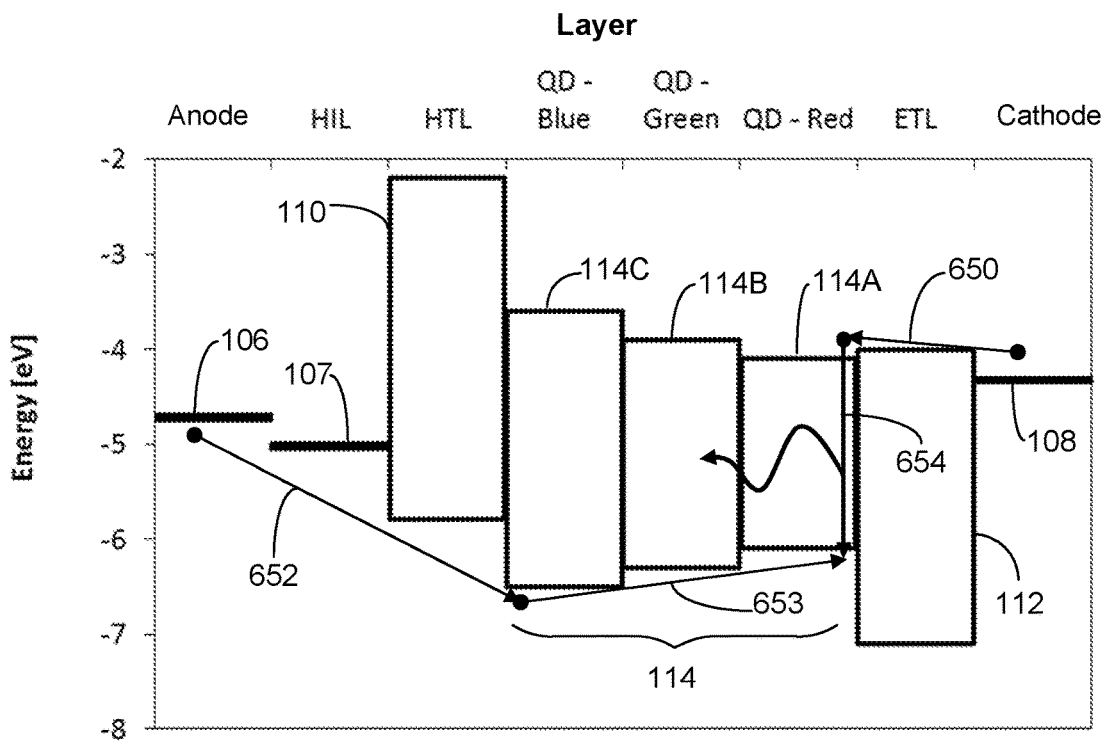

FIG. 6 shows an exemplary band structure of a light-emitting device similar to 102A, which includes an emissive layer 114 including sub-layers 114A, 114B, and 114C. The light-emitting device is similar to the light-emitting device 102A shown in FIG. 1, but additionally includes a hole injection layer 107 disposed between the anode electrode 106 and the hole transport layer 110. Furthermore, as contrasted with the band structure shown in FIG. 4, the electron transport layer 112 is configured as the limiting charge transport layer. In the exemplary embodiment, layer 114C is configured to emit blue light, layer 114B is configured to emit green light, and layer 114A is configured to emit red light. As such, in some embodiments, the light emitting device may be provided as a red pixel (or sub-pixel), e.g., in a display device. In the exemplified embodiment, the blue light emitting layer 114C has a wider band gap than the band gap of the green light emitting layer 114B, and the green light emitting layer 114B has a wider band gap than the band gap of the red light emitting layer 114A. As shown in FIG. 5, electrons are injected from the cathode 108 and are transported through the electron transport layer 112 to the emissive layer 114A (as indicated by arrow 650). Holes are injected from the anode 106 and are transferred to the emissive layer 114C through the hole transport layer 110 (as indicated by arrows 652 and 653). The holes transfer through the blue light emissive sub-layer 114A and through the green light emissive sub-layer 1146 because few or no injected electrons are present in this layer for them to recombine with. The holes recombine radiatively (as indicated by arrow 654) with the electrons. Such recombination and emission of light occurs proximate the interface of the emissive layer 114C and the electron transport layer 112, which is the limiting charge transport layer. This gives emission primarily from the red QDs proximate the interface of the electron transport layer 112 and emissive layer 114C, which may result in single colored emission (e.g., red light).

Turning now to FIGS. 7A-7G, an exemplary method of producing a device including light-emitting devices 102A, 102B, 102C is shown. The exemplary fabrication method described with respect FIGS. 7A-7G involves the formation of light-emitting devices by successive steps of deposition of the emissive layers followed by the removal of certain regions (e.g., via a stamp). The formed device includes light-emitting devices having different emissive layers, with some of the devices having an emissive layer formed of more than one layer. As described above, the types of QDs used in the respective layers 114A, 1146, 114C may be different from one another. As such, the different layers 114A, 114B, 114C may be capable of emitting different respective wavelengths of light. The exemplary fabrication method may allow for a conventionally low-resolution patterning technique to be used in connection with a higher-resolution method (e.g., by refining the pattern by the subsequent removal of certain regions using selective removal steps).

Figure 7A:
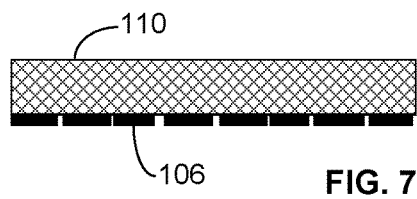
FIGS. 7A-7G are schematic cross-sectional views showing the production of an exemplary device including light-emitting devices, in accordance with an exemplary method of the present disclosure.

As shown in FIG. 7A, a hole transport layer 110 (charge transport layer) is formed on the anode electrodes 106. In some embodiments, the hole transport layer may be deposited on the electrodes 106 by a method such as, but not limited to: dip coating, spin coating, spray coating, slot-die process or various printing methods such as inkjet printing. In some embodiments, the hole transport layer may be cured (e.g., heated) prior to deposition of subsequent layers. While FIGS. 7A-7G do not show a substrate, it will be appreciated that in some embodiments the electrodes 106 may be formed on a substrate (e.g., as shown in FIG. 1) prior to deposition of the hole transport layer 100. The electrodes 106 may be formed by a method such as, but not limited to, sputtering, evaporative coating, printing, chemical vapor deposition, and the like. Furthermore, the electrodes 106 may be provided in any suitable form. For example, the electrodes may be configured such that they can be driven independently by driving circuitry (e.g., 140 as shown in FIG. 7G). In one exemplary implementation, the electrodes 106 are configured for use in respective TFT circuits.

Figure 7B:
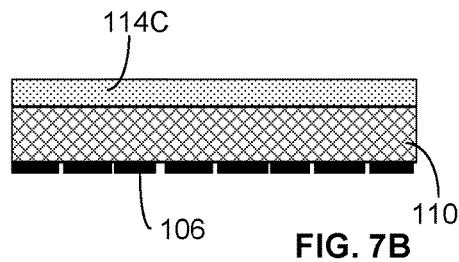

As shown in FIG. 7B, a first emissive layer 114C is formed on the hole transport layer 110. In some embodiments, the emissive layer 114C may be deposited on the hole transport layer 110 by a method such as, but not limited to: dip coating, spin coating, spray coating, slot-die process or various printing methods such as inkjet printing. In some embodiments, the deposited first emissive layer 114C may be cured (e.g., heated or exposed to UV light).

Figure 7C:
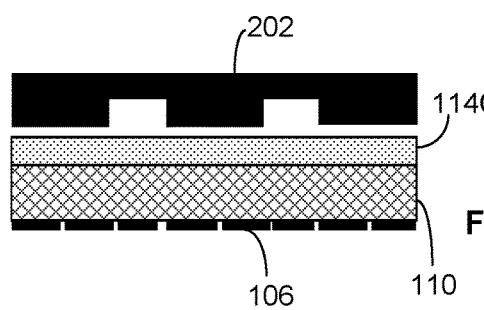

As shown in FIG. 7C, a patterned stamp 202 is brought into contact with the first emissive layer 114C to selectively remove certain areas of the layer. In some embodiments, removal of areas of the layer via the patterned stamp 202 may be through attraction of the material of the first emissive layer 114C to the patterned regions of the stamp, followed by their removal. In other embodiments, removal of areas of the layer via the patterned stamp 202 may be through adhesion of the material of the first emissive layer 114C to the patterned regions of the stamp, followed by their removal. In other embodiments, removal of areas of the layer via the patterned stamp 202 may be through soaking the stamp in an appropriate solvent to selectively dissolve parts of the first emissive layer 114C. Exemplary solvents include but are not limited to the following or mixtures including the following: acetone, dichloromethane, chloroform, linear or branched alkyl acetates (e.g. ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3, 5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA).

Figure 7D:
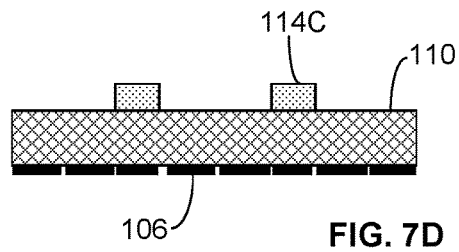

As shown in FIG. 7D, this removal process leaves the first emissive layer 114C only on the hole transport layer 110 in certain regions.

Figure 7E:
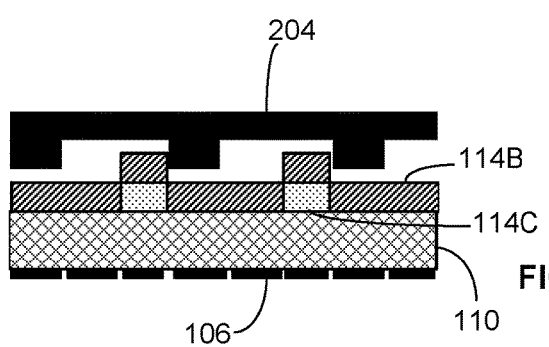

As shown in FIG. 7E, subsequent to the removal of certain parts of the first emissive layer 114C, a second emissive layer 114B is deposited so that it covers both the remaining part of the first emissive layer 114C and is also in contact (e.g., direct contact) with the exposed portions hole transport layer 110. In some embodiments, the emissive layer 114B may be deposited by a method such as, but not limited to: dip coating, spin coating, spray coating, slot-die process or various printing methods such as inkjet printing. In some embodiments, the deposited first emissive layer 114C may be cured (e.g., heated or exposed to UV light) before deposition of subsequent emissive layers. FIG. 7E also shows that, following deposition and optional curing of the second emissive layer 114B, a second patterned stamp 204 may be brought into contact with the second emissive layer 114B to selectively remove certain areas. In some embodiments, removal of areas of the layer via the patterned stamp 204 may be through attraction of the material of the second emissive layer 114B to the patterned regions of the stamp, followed by their removal. In other embodiments, removal of areas of the layer via the patterned stamp 204 may be through adhesion of the material of the second emissive layer 114B to the patterned regions of the stamp, followed by their removal. In other embodiments, removal of areas of the layer via the patterned stamp 204 may be through soaking the stamp in an appropriate solvent to selectively dissolve parts of second emissive layer 114B. Exemplary solvents include those described in connection with FIG. 7C.

This removal process may leave the regions of the first emissive layer 114C, as well as regions including the second emissive layer 114B. Some of the remaining second emissive layer 114B is provided on top of the remaining first emissive layer 114A, while the other portion of the remaining second emissive layer 114B is deposited (e.g., directly deposited) on the hole transport layer. As such, the device includes regions where the emissive layer includes only the second emissive layer 114B, regions where the emissive layer includes the second emissive layer 114B on top of the first emissive layer 114C, as well as regions with no emissive layer and only an exposed hole transport layer 110.

Figure 7F:
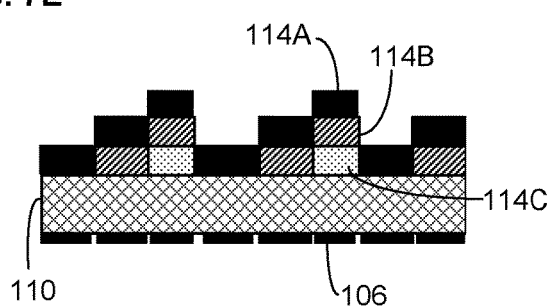
Figure 7G:
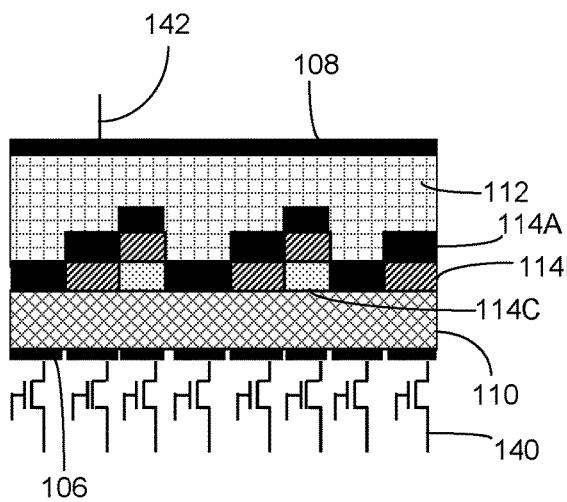

As shown in FIG. 7F, subsequent to the removal of certain parts of the second emissive layer 114B a third emissive layer 114A is deposited on the remaining second emissive layer 114B, as well as the exposed portions of the hole transport layer 110. In some embodiments, the emissive layer 114A may be deposited by a method such as, but not limited to: dip coating, spin coating, spray coating, slot-die process or various printing methods such as inkjet printing. In some embodiments, the deposited second emissive layer 114B may be cured (e.g., heated or exposed to UV light) prior to the deposition of the third emissive layer 114A. The third emissive layer 114A may also be cured (e.g., heated or exposed to UV light) after deposition. As shown, the deposited first, second, and third emissive layers 114A, 114B, 114C form three distinct types of emissive layers 114: a type of region with only the third emissive layer 114A directly on top of the hole transport layer; a type of region with the third emissive layer 114A on top of the second emissive layer 114B, which is on top of the hole transport layer; and a type of region with the third emissive layer 114A on top of the second emissive layer 114B, which is on top of the first emissive layer 114C, which is on top of the hole transport layer. These three distinct types of emissive layers respectively form the emissive layers of the different types of light-emitting devices 102A, 102B, 102C.

As shown in FIG. 7G, following patterning of the respective emissive layers, the device structure is completed by the deposition of an electron transport layer 112 (charge transport layer) and an electrode 108. In the embodiment shown, both the charge transport layer and the electrode are common to the respective light-emitting devices provided. In some embodiments, the electron transport layer may be deposited by a method such as, but not limited to: dip coating, spin coating, spray coating, slot-die process or various printing methods such as inkjet printing. In some embodiments, the electron transport layer may be cured (e.g., heated) prior to deposition of the electrode 108. The electrode 108 may be formed by a method such as, but not limited to, sputtering, evaporative coating, printing, chemical vapor deposition, and the like. In some embodiments, the electrode 108 may be configured such that it is connected (e.g., via 142) to applicable circuitry.

In the exemplary embodiment shown in FIGS. 7A-7G, the device is fabricated to include three different types of light light-emitting devices. This may result in a device having light-emitting devices in respective regions that can emit one of three different colors. It is clear that if more, or fewer, than three regions of different color emission were desired, this method could be iterated a different number of times to generate layer stacks within the emissive layer with 1, 2, 3 . . . n different layers within each region.

Turning now to FIGS. 8A-8G, an exemplary method of producing a device including light-emitting devices 102A, 102B, 102C is shown. The exemplary fabrication method described with respect FIGS. 7A-7G involves the formation of light-emitting devices using a photo-patterning method, with successive removal of photoresists following deposition of emissive layers. As described above, the types of QDs used in the respective layers 114A, 114B, 114C may be different from one another. As such, the different layers 114A, 114B, 114C may be capable of emitting different respective wavelengths of light.

Figure 8A:
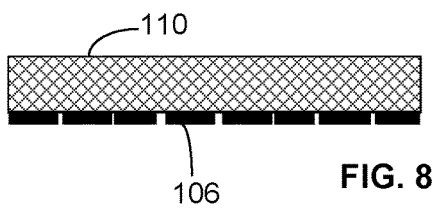
FIGS. 8A-8G are schematic cross-sectional views showing the production of an exemplary device including light-emitting devices, in accordance with an exemplary method of the present disclosure.

As shown in FIG. 8A, a hole transport layer 110 (charge transport layer) is formed on the anode electrodes 106. In some embodiments, the hole transport layer may be deposited on the electrodes 106 by a method such as, but not limited to: dip coating, spin coating, spray coating, slot-die process or various printing methods such as inkjet printing. In some embodiments, the hole transport layer may be cured (e.g., heated) prior to deposition of subsequent layers. While FIGS. 8A-8G do not show a substrate, it will be appreciated that in some embodiments the electrodes 106 may be formed on a substrate (e.g., as shown in FIG. 1) prior to deposition of the hole transport layer 100. The electrodes 106 may be formed by a method such as, but not limited to, sputtering, evaporative coating, printing, chemical vapor deposition, and the like. Furthermore, the electrodes 106 may be provided in any suitable form. For example, the electrodes may be configured such that they can be driven independently by driving circuitry (e.g., 140 as shown in FIG. 8G). In one exemplary implementation, the electrodes 106 are configured for use in respective TFT circuits.

Figure 8B:
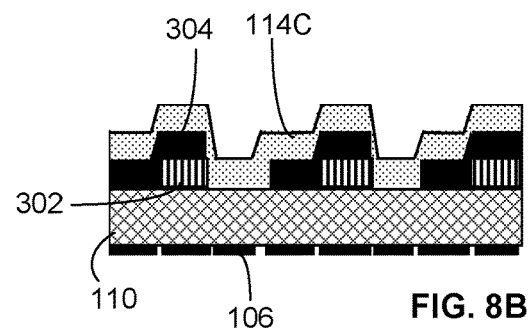

As shown in FIG. 8B, following the deposition of the hole transport layer 110, two separate layers of photoresist, a first photoresist layer 302 and a second photoresist layer 304, are deposited, patterned and cured, such that three types of region are defined on the substrate: regions without any photoresist covering the hole transport layer, regions with only the second photoresist layer 304 covering the hole transport layer 110, and regions with both the first and second photoresist layers 302, 304 (in a stacked manner) covering the hole transport layer 110. This patterning and curing is possible through, for example, UV exposure followed by washing with an appropriate developer. A first emissive layer 114C is then deposited, followed by optional curing (e.g., heating) and/or crosslinking of the first emissive layer 114C. As an example, in some embodiments, the curing and/or crosslinking may help to improve the robustness of the first emissive layer 114C against dissolution in the subsequent resist removal.

Figure 8C:
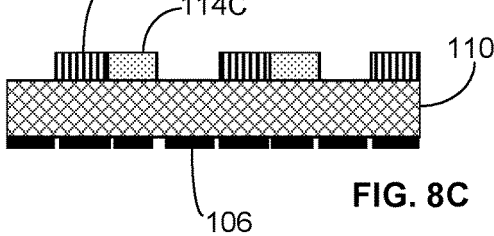

As shown in FIG. 8C, the second photoresist layer 304 is removed by dissolving it in an appropriate organic or aqueous solvent. Exemplary solvents include but are not limited to the following or mixtures including the following: acetone, dichloromethane, chloroform, linear or branched alkyl acetates (e.g. ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA). Removal of the second photoresist layer 304 partially removes the first emissive layer 114C, leaving it only in certain regions. The first photoresist layer 302 also remains, which should be robust against attack from the solvent used to remove the second photoresist layer 304. This can be achieved, for example, by choosing the first photoresist layer 302 to be soluble in an aqueous solvent and the second photoresist layer 304 to be soluble in an organic solvent.

Figure 8D:
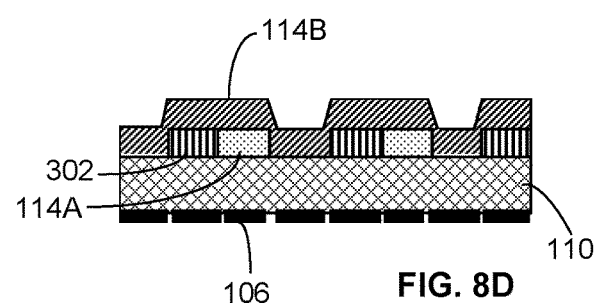

As shown in FIG. 8D, following the removal of the second photoresist layer 304, a second emissive layer 114B is deposited, again followed by optional curing and/or crosslinking reaction to improve layer robustness.

Figure 8E:
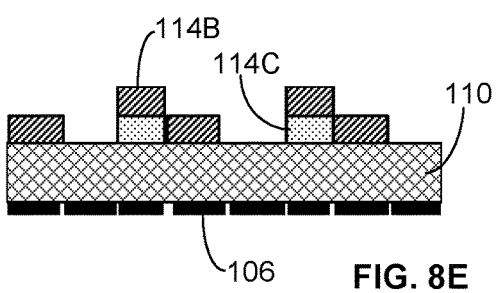

As shown in FIG. 8E, the first photoresist layer 302 is removed by dissolving it in an appropriate organic or aqueous solvent. This partially removes the second emissive layer 114B, leaving it only in certain regions such that three types of region exist on the hole transport layer 110: regions with a first and second emissive layer 114B, 114C (in a stacked manner) on top of the hole transport layer, regions with only the second emissive layer 114B on top of the hole transport layer 110, and regions with no emissive layer on the hole transport layer 110.

Figure 8F:
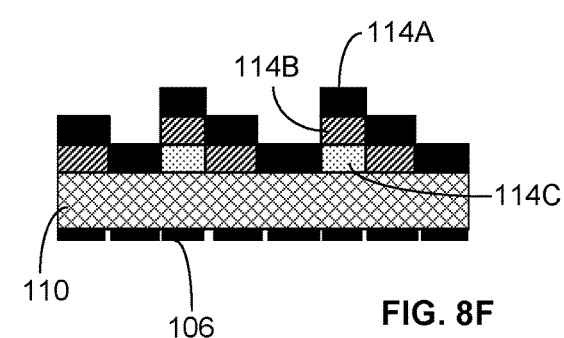
Figure 8G:
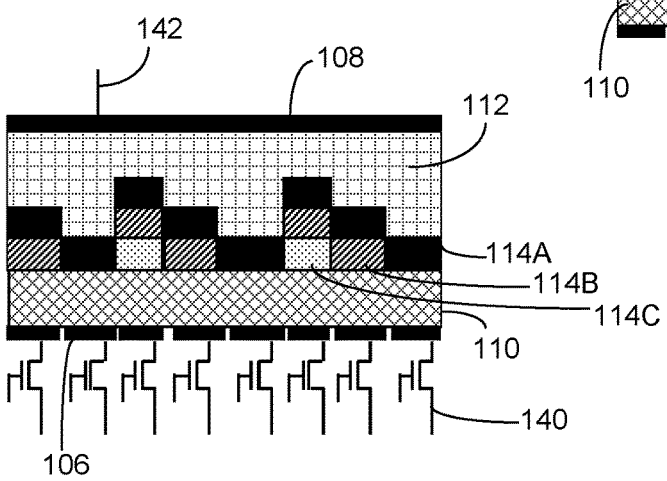

As shown in FIG. 8F, a third emissive layer 114A is deposited on the remaining second emissive layer 114B, as well as the exposed portions of the hole transport layer 110. In some embodiments, the third emissive layer 114A may be deposited by a method such as, but not limited to: dip coating, spin coating, spray coating, slot-die process or various printing methods such as inkjet printing. In some embodiments, the deposited third emissive layer 114A may be cured (e.g., heated) and/or crosslinked. As shown, the deposited first, second, and third emissive layers 114A, 114B, 114C form three distinct types of emissive layers 114: a type of region with only the third emissive layer 114A directly on top of the hole transport layer; a type of region with the third emissive layer 114A on top of the second emissive layer 114B, which is on top of the hole transport layer; and a type of region with the third emissive layer 114A on top of the second emissive layer 114B, which is on top of the first emissive layer 114C, which is on top of the hole transport layer. These three distinct types of emissive layers respectively form the emissive layers of the different types of light-emitting devices 102A, 102B, 102C.

As shown in FIG. 8G, following patterning of the respective emissive layers, the device structure is completed by the deposition of an electron transport layer 112 (charge transport layer) and an electrode 108. In the embodiment shown, both the charge transport layer and the electrode are common to the respective light-emitting devices provided. In some embodiments, the electron transport layer may be deposited by a method such as, but not limited to: dip coating, spin coating, spray coating, slot-die process or various printing methods such as inkjet printing. In some embodiments, the electron transport layer may be cured (e.g., heated) prior to deposition of the electrode 108. The electrode 108 may be formed by a method such as, but not limited to, sputtering, evaporative coating, printing, chemical vapor deposition, and the like. In some embodiments, the electrode 108 may be configured such that it is connected (e.g., via 142) to applicable circuitry.

It will be appreciated that in either of the above-described methods, one or more additional layers (e.g., charge injection layer(s) such as hole injection layer and/or electron injection layer) may be formed as a part of the device. These one or more additional layers may be formed via deposition (e.g., coating) and curing (e.g., heating).

Figure 9:
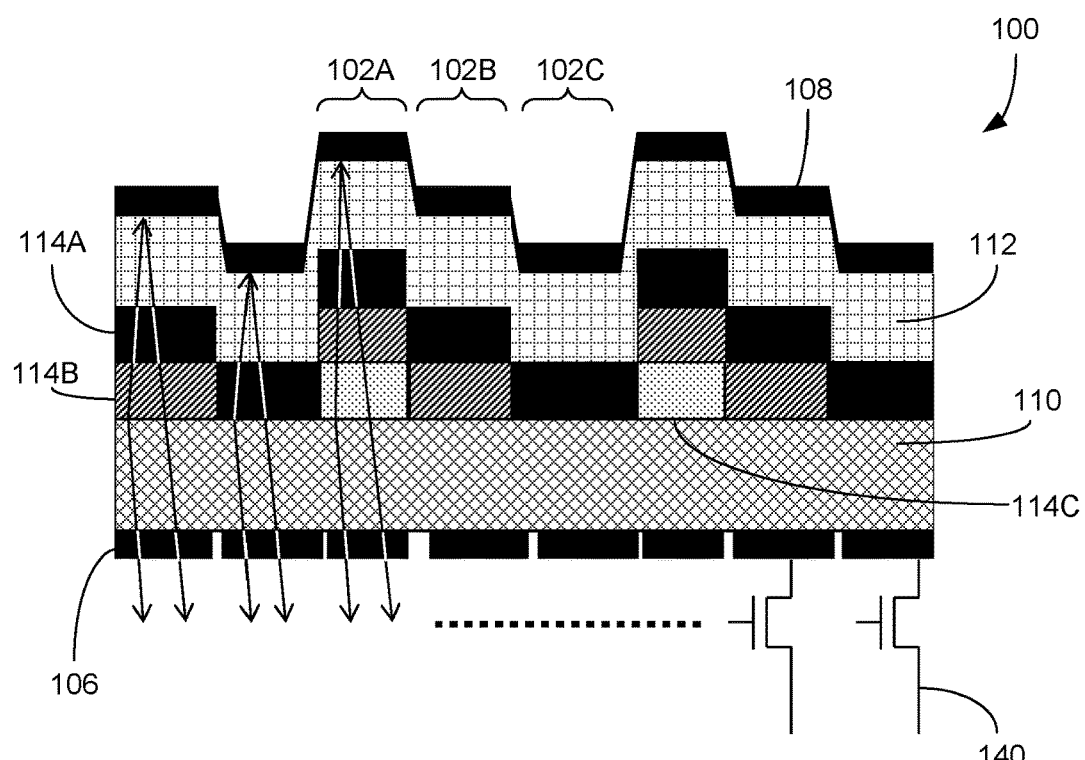
FIGS. 9-11 are schematic cross-sectional views of exemplary devices including light-emitting devices, in accordance with the present disclosure.

Turning now to FIG. 9, an exemplary device including multiple light-emitting devices is shown. The device is similar to the device described above as shown in FIG. 1, but is embodied specifically as a "bottom-emitting" structure. In the exemplary embodiment, charge transport layer 110 is a hole transport layer and charge transport layer 112 is an electron transport layer. As such, electrode 108 is configured to reflect light emitted from the emissive layers 114A, 114B, 114C; and electrodes 106 are configured such that they are transparent or only weakly reflecting, and light is emitted through the electrodes 106 and through the substrate (not shown). The reflection and transmission of emitted light are shown schematically by the arrows. In the example, the hole transporting layer 110 is the limiting charge transport layer; the narrowest bandgap of the emissive layers is in the first emissive layer 114C; the bandgap of the second emissive layer 114B is greater than the bandgap of the first emissive layer 114C; and the bandgap of the third emissive layer 114A is greater than the bandgap of the second emissive layer 114B.

The cavity structure shown in FIG. 9 exemplifies how the extra sub-layers of light-emitting devices 102A and 102B (e.g., the G and R pixels) extend the cavity length for the same thickness of charge transport layer 112. Optical interference between the light emitted from the emissive layer towards the anode electrodes 106 and towards the cathode electrode 108 may affect the amount of light which is outcoupled from the device (i.e. into air), the angular distribution of the outcoupled light, and/or the spectrum of the outcoupled light. It may be advantageous to set the distance between the emissive layer which emits light and the cathode electrode 108, in order to provide suitable optical interference and therefore suitable outcoupling of light. For light-emitting devices 102A where the emissive layer 114C is emitting, a distance between the emissive layer 114C and the cathode electrode 108 depends on the thickness of the second and third emissive layers 114B, 114A, and the thickness of the charge transport layer 112. For the lighting-emitting devices 102B where the second emitting layer 114B is emitting, a distance between the emissive layer 114B and the cathode electrode 108 depends on the thickness of the third emissive layer 114A and the thickness of the charge transport layer 112. For light-emitting devices 102C where the third emissive layer 114A is emitting, a distance between the emissive layer 114A and cathode electrode 108 depends on the thickness of the charge transport layer 112. Advantageously, therefore, at least two of these distances (e.g., the distances described above that are associated with light-emitting devices 102A, 102b, and 102C) can be set to values optimal for optical outcoupling from the first, second and third emissive layers 114C, 114B, 114A using a charge transport layer 112 which may have a uniform thickness among the respective light-emitting devices, through selection of the thicknesses of the first and second emissive layers 114A, 114B.

For suitable outcoupling, these distances should generally be longer for emitted light with longer wavelength, for example such that the light reflected from the electrode 108 is in phase with the light directly emitted from the emissive layer. Therefore, since the emissive layer bandgap energy increases from the first to second to third emissive layer (i.e. the emission wavelength decreases from the first to second to third emissive layer), the structure may provide the variation in these distances. For example, if the emissive layers and the charge transport layers have a refractive index of approximately 2, the first emissive layer 114C contains QDs which emit light with peak wavelength 630 nm, the second emissive layer 114B contains QDs which emit light with peak wavelength 530 nm, and the third emissive layer 114A contains QDs which emit light with peak wavelength 470 nm, the electron transport layer 112 could be uniformly 45 nm, the first emissive layer 114C could be 14 nm, the second emissive layer 114B could be 9 nm and the third emissive layer 114A could be 7 nm. This structure may provide first, second and third distances each corresponding to the same number of wavelengths of the emitted light in each light-emitting device 102A, 102B, 102C.

In some embodiments, the thickness of the first, second and third emissive layers may be provided such that the distance between the interface of the emissive layer and limiting charge transfer layer and the reflective contact is substantially equal to a quarter of a wavelength for each of the regions emitting a different color of light.

Figure 10:
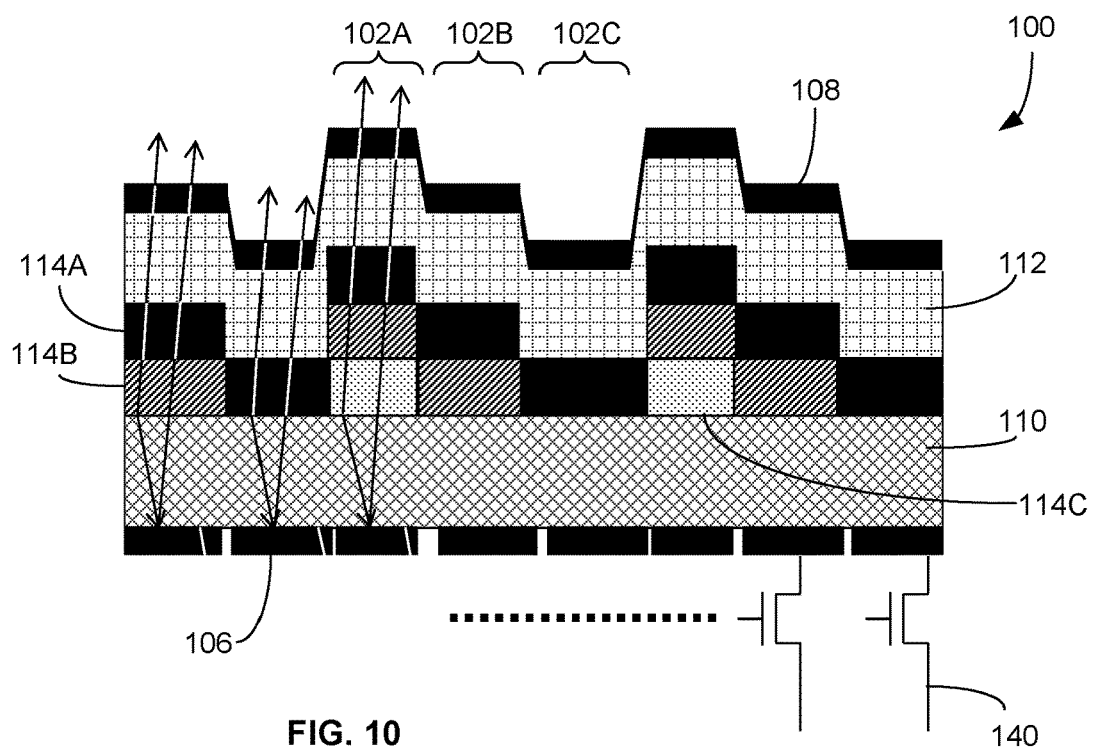

Turning now to FIG. 10, an exemplary device including multiple light-emitting devices is shown. The device is similar to the device described above as shown in FIG. 1, but is embodied specifically as a "top-emitting" structure. In the exemplary embodiment, charge transport layer 110 is a hole transport layer and charge transport layer 112 is an electron transport layer. As such, anode electrodes 106 are reflecting of light emitted from the emissive layers, and cathode electrode 108 is partially transparent and partially reflecting, and light is emitted through the cathode electrode 108. The reflection and transmission of emitted light are shown schematically by the arrows. In the example, the hole transporting layer 110 is the limiting charge transport layer; the narrowest bandgap of the emissive layers is in the first emissive layer 114C; the bandgap of the second emissive layer 114B is greater than the bandgap of the first emissive layer 114C; and the bandgap of the third emissive layer 114A is greater than the bandgap of the second emissive layer 114B.

The cavity structure shown in FIG. 10 exemplifies how the extra emissive layers can extend the cavity length for the same thickness of charge transport layer 112. Since the electrodes 106 and electrode 108 are at least partially reflecting, an optical cavity is formed between these electrodes. Owing to this optical cavity, the distances of the emissive layer which is emitting light from the electrodes 106 and electrode 108 has a strong effect on the properties of outcoupled light. Advantageously in this example, the total cavity length (i.e. the distance between an electrode 106 and the electrode 108) of the first light-emitting device 102A where the first emissive layer 114C is emitting may be adjusted based on the thickness of the second and third emissive layers 114b, 114C, and the thickness of the charge transport layers 110, 114. The total cavity length of the second light-emitting device 102B where the second emissive layer 114B is emitting may be adjusted based on the thickness of the third emissive layer, and the thickness of the charge transport layers 110, 112. The total cavity length of the third light-emitting device 102C where the third emissive layer 114C is emitting may be adjusted based on the thickness of the charge transport layers 110, 112. Furthermore, the position of the emissive layer within each cavity (i.e. the ratio of the distance between the emitting region and the two electrodes) may be optimized. This may enable a structure where the outcoupling is optimized for at least two of the emitting regions using charge transport layers 110, 112 with uniform thickness among the respective light-emitting devices. For suitable outcoupling, the total cavity length should generally be longer for emitted light with longer wavelength. Therefore, since the emissive layer bandgap energy increases from the first to second to third emissive layers (i.e. the emission wavelength decreases from the first to second to third EML), the structure may provide the variation in these distances.

In some embodiments, the thickness of the first, second and third emissive layers may be provided such that the distance between the interface of the emissive layer and limiting charge transfer layer and the reflective contact is substantially equal to a quarter of a wavelength for each of the regions emitting a different color of light.

Figure 11:
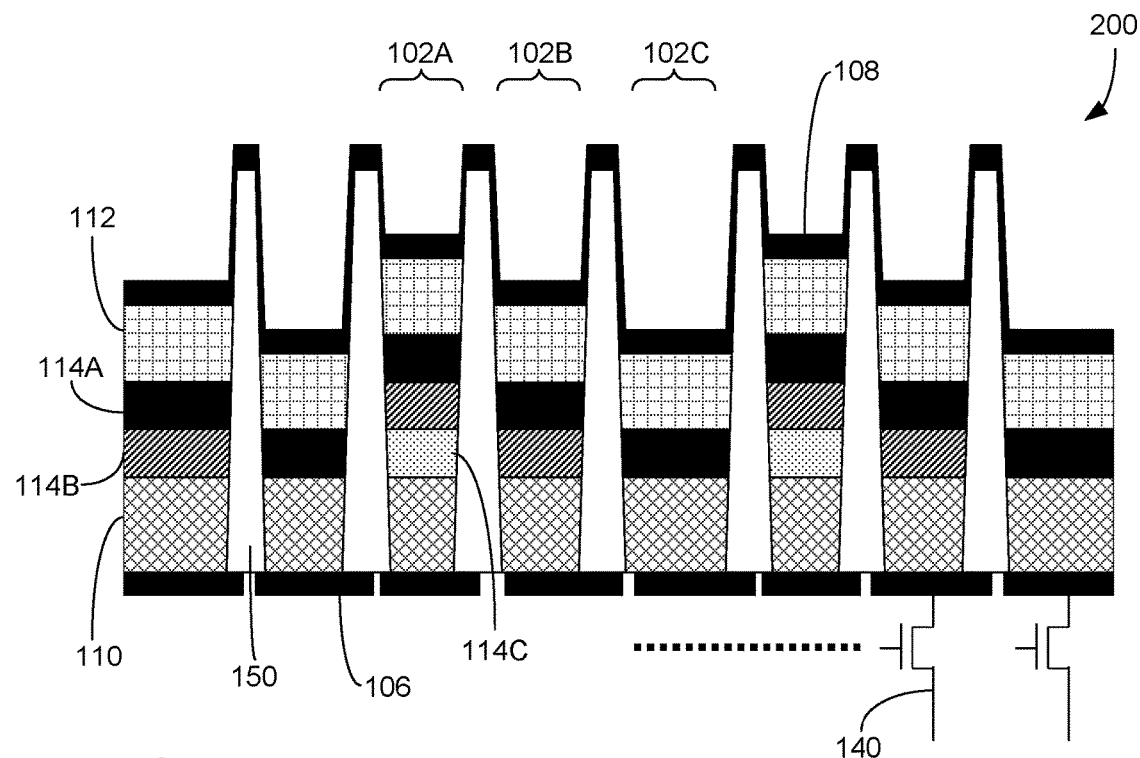

In some embodiments, these light-emitting devices may be arranged such that they are separated by one or more insulating materials. This arrangement may also be referred to as a "bank structure." FIG. 11 shows such an exemplary arrangement of light-emitting devices at 200. The bank structure may define the emitting regions (e.g., pixels, sub-pixels) and provide electrical isolation between the light-emitting devices. As shown, the insulating material 150 extends in the thickness direction and separates the respective charge transport layers 110, 112 and emissive layers 114 of the respective light-emitting devices 102A, 102B, 102C. Exemplary insulating materials may include, but are not limited to, polyimides. In some examples, the insulating material may include surface treatment (e.g. fluorine) in order to modify its wetting properties (e.g. made hydrophilic to prevent the deposited material from sticking on the banks and to ensure the subpixel is filled properly). In some embodiments, the bank structure may be formed on the substrate (not shown) prior to the deposition of other layers. The bank structure may be patterned by any suitable method such as a photolithographic method or inkjet printed. The other layers could then be deposited as previously described, and the common electrode 108 could be deposited to join adjacent regions to provide charge injection into the light emitting regions.

Figure 12:
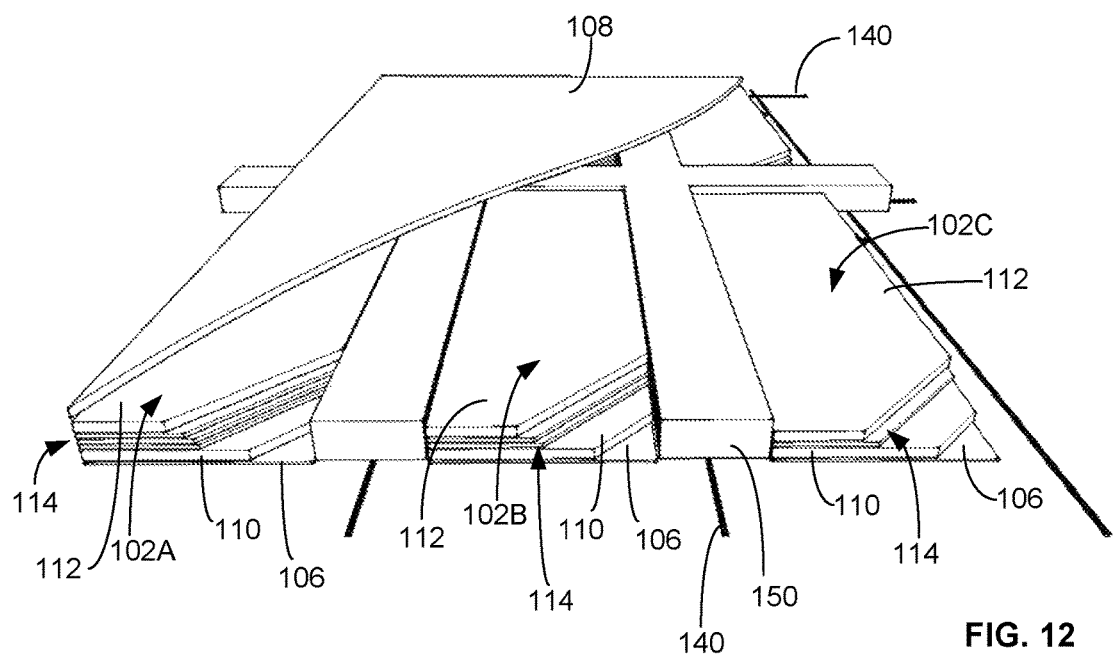
FIG. 12 is a schematic perspective view of an exemplary pixel arrangement including light-emitting devices, in accordance with the present disclosure.

FIG. 12 further shows a perspective view of an exemplary pixel (sub-pixel) arrangement. As shown, the respective light-emitting devices 102A, 102B, 102C, which may be formed in accordance with the methods described above, are separated by an insulating material (e.g., a bank structure). the light-emitting devices 102A, 102B, 102C may be capable of emitting different respective colors of light (e.g., R, G, B). Circuitry 140 (e.g., drive electronics) is coupled to the electrodes of the respective light-emitting devices.

Example 1—Production of a Top Emitting Light-Emitting Device 100 nm of aluminum is thermally evaporated through a shadow mask onto a 1 mm thick glass substrate to define a cathode region. ZnO nanoparticles are mixed in ethanol and deposited on top of the cathode by spin coating then baked at 110° C. to form an electron transport layer. CdSe/CdS quantum dots are deposited and patterned by a previously described deposition and patterning method. $MoO_3$ nanoparticles are deposited on top of the emissive layer by spin coating from ethanol followed by baking at 70° C. to form a hole transport layer. 25 nm of silver is thermally evaporated on top of the hole transport layer to provide a partially reflective semi-transparent anode.

The above-described process produces a top emitting structure including: 1 mm glass substrate|100 nm Al cathode|45 nm ZnO electron transport layer|Patterned CdSe/CdS QD emissive layer as previously described|60 nm $MoO_3$ hole transport layer|25 nm Ag anode.

Example 2—Production of a Bottom Emitting Light-Emitting Device 150 nm of ITO is sputtered through a shadow mask onto a 1 mm thick glass substrate to define a semi-transparent anode region. PEDOT:PSS in aqueous solution is deposited on top of the anode by spin coating then baked at 150° C. to form a hole injection layer. TFB dissolved in chlorobenzene is deposited on top of the hole injection layer by spin coating then baked at 110° C. to form a hole transport layer. CdSe/CdS quantum dots are deposited and patterned by a previously described deposition and patterning method. ZnO nanoparticles are deposited on top of the emissive layer by spin coating from ethanol followed by baking at 110° C. to form an electron transport layer. 100 nm of aluminum is thermally evaporated on top of the electron transport layer to provide a reflective cathode.

The above-described process produces a bottom emitting structure including: 1 mm glass substrate|150 nm ITO anode|50 nm PEDOT:PSS hole injection layer|35 nm TFB hole transport layer|Patterned CdSe/CdS QD emissive layer as previously described|45 nm ZnO electron transport|100 nm Al cathode.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A device, comprising:
a first light-emitting device, the first light emitting device comprising:
an anode;
a cathode;
charge transport layers disposed between the anode and the cathode; and
an emissive layer disposed between the charge transport layers, the emissive layer comprising first quantum dots, the emissive layer configured to emit light at a first wavelength upon radiative recombination of holes and electrons therein; and
a second light-emitting device, the second light-emitting device comprising:
an anode;
a cathode;
charge transport layers disposed between the anode and the cathode; and
an emissive layer disposed between the charge transport layers, the emissive layer comprising emissive sub-layers, a first one of the emissive sub-layers comprising the first quantum dots, the first one of the emissive sub-layers configured to emit light at the first wavelength upon radiative recombination of holes and electrons therein, a second one of the emissive sub-layers comprising second quantum dots, the second one of the emissive sub-layers configured to emit light at a second wavelength different than the first wavelength upon radiative recombination of holes and electrons therein, the first one of the emissive sub-layers of the second light-emitting device and the second one of the emissive sub-layers of the second light-emitting device provided in a stacked arrangement in a thickness direction between the anode and the cathode,
wherein the charge transport layers of the respective light-emitting devices comprise a hole transport layer proximate the anode and an electron transport layer proximate the cathode, and
wherein:
the hole transport layer is a limiting charge transfer layer having a hole mobility lower than an electron mobility of the electron transport layer;
the second one of the emissive sub-layers of the second light-emitting device has a narrower band gap than the first one of the emissive sub-layers of the second light-emitting device; and
the second one of the emissive sub-layers of the second light-emitting device is located closer to the hole transport layer than the first one of the emissive sub-layers of the second light-emitting device.

2. The device of claim 1, wherein the first wavelength and the second wavelength are separated by more than 40 nm.

3. The device of claim 1, wherein:
the first light-emitting device is configured to emit light of a single color corresponding to the first wavelength; and
the second light-emitting device is configured to emit light of a single color corresponding to the second wavelength.

4. The device of claim 1, wherein the charge transport layers are common to the light-emitting devices.

5. The device of claim 1, wherein the cathodes of the respective light-emitting devices are a part of a common cathode that is common to the light-emitting devices.

6. A device, comprising:
a first light-emitting device, the first light emitting device comprising:
an anode;
a cathode;
charge transport layers disposed between the anode and the cathode; and
an emissive layer disposed between the charge transport layers, the emissive layer comprising first quantum dots, the emissive layer configured to emit light at a first wavelength upon radiative recombination of holes and electrons therein; and
a second light-emitting device, the second light-emitting device comprising:
an anode;
a cathode;
charge transport layers disposed between the anode and the cathode; and an emissive layer disposed between the charge transport layers, the emissive layer comprising emissive sub-layers, a first one of the emissive sub-layers comprising the first quantum dots, the first one of the emissive sub-layers configured to emit light at the first wavelength upon radiative recombination of holes and electrons therein, a second one of the emissive sub-layers comprising second quantum dots, the second one of the emissive sub-layers configured to emit light at a second wavelength different than the first wavelength upon radiative recombination of holes and electrons therein, the first one of the emissive sub-layers of the second light-emitting device and the second one of the emissive sub-layers of the second light-emitting device provided in a stacked arrangement in a thickness direction between the anode and the cathode,
wherein the charge transport layers of the respective light-emitting devices comprise a hole transport layer proximate the anode and an electron transport layer proximate the cathode, and
wherein:
the electron transport layer is a limiting charge transfer layer having an electron mobility lower than a hole mobility of the hole transport layer;
the second one of the emissive sub-layers of the second light-emitting device has a narrower band gap than the first one of the emissive sub-layers of the second light-emitting device; and
the second one of the emissive sub-layers of the second light-emitting device is located closer to the electron transport layer than the first one of the emissive sub-layers of the second light-emitting device.

7. The device of claim 6, wherein the first wavelength and the second wavelength are separated by more than 40 nm.

8. The device of claim 6, wherein:
the first light-emitting device is configured to emit light of a single color corresponding to the first wavelength; and
the second light-emitting device is configured to emit light of a single color corresponding to the second wavelength.

9. The device of claim 6, wherein the charge transport layers are common to the light-emitting devices.

10. The device of claim 6, wherein the cathodes of the respective light-emitting devices are a part of a common cathode that is common to the light-emitting devices.

11. A device, comprising:
a first light-emitting device, the first light emitting device comprising:
an anode;
a cathode;
charge transport layers disposed between the anode and the cathode; and
an emissive layer disposed between the charge transport layers, the emissive layer comprising first quantum dots, the emissive layer configured to emit light at a first wavelength upon radiative recombination of holes and electrons therein;
a second light-emitting device, the second light-emitting device comprising:
an anode;
a cathode;
charge transport layers disposed between the anode and the cathode; and
an emissive layer disposed between the charge transport layers, the emissive layer comprising emissive sub-layers, a first one of the emissive sub-layers comprising the first quantum dots, the first one of the emissive sub-layers configured to emit light at the first wavelength upon radiative recombination of holes and electrons therein, a second one of the emissive sub-layers comprising second quantum dots, the second one of the emissive sub-layers configured to emit light at a second wavelength different than the first wavelength upon radiative recombination of holes and electrons therein, the first one of the emissive sub-layers of the second light-emitting device and the second one of the emissive sub-layers of the second light-emitting device provided in a stacked arrangement in a thickness direction between the anode and the cathode; and
a third light-emitting device, the third light-emitting device comprising:
an anode;
a cathode;
charge transport layers disposed between the anode and the cathode; and
an emissive layer disposed between the charge transport layers, the emissive layer comprising emissive sub-layers, a first one of the emissive sub-layers comprising the first quantum dots, the first one of the emissive sub-layers configured to emit light at the first wavelength upon radiative recombination of holes and electrons therein, a second one of the emissive sub-layers comprising the second quantum dots, the second one of the emissive sub-layers configured to emit light at the second wavelength different than the first wavelength upon radiative recombination of holes and electrons therein, a third one of the emissive sub-layers comprising third quantum dots, the third one of the emissive sub-layers configured to emit light at a third wavelength different than the first wavelength and different from the second wavelength upon radiative recombination of holes and electrons therein, the first one of the emissive sub-layers of the third light-emitting device, the second one of the emissive sub-layers of the third light-emitting device, and the third one of the emissive sub-layers of the third light-emitting device provided in a stacked arrangement in a thickness direction between the anode and the cathode.

12. The device of claim 11, wherein the first wavelength, the second wavelength, and the third wavelength are each separated by more than 40 nm.

13. The device of claim 11, wherein:

the first light-emitting device is configured to emit light of a single color corresponding to the first wavelength;

the second light-emitting device is configured to emit light of a single color corresponding to the second wavelength; and the third light-emitting device is configured to emit light of a single color corresponding to the third wavelength.

14. The device of claim 11, wherein the first wavelength is within the range of 400 nm-490 nm, the second wavelength is within the range of 500 nm-590 nm, and the third wavelength is within the range of 600 nm-700 nm.

15. The device of claim 11, wherein the charge transport layers of the respective light-emitting devices comprise a hole transport layer proximate the anode and an electron transport layer proximate the cathode.

16. The device of claim 15, wherein:

the hole transport layer is a limiting charge transfer layer having a hole mobility lower than an electron mobility of the electron transport layer;

for the second light-emitting device:

the second one of the emissive sub-layers of the second light-emitting device has a narrower band gap than the first one of the emissive sub-layers of the second light-emitting device; and the second one of the emissive sub-layers of the second light-emitting device is located closer to the hole transport layer than the first one of the emissive sub-layers of the second light-emitting device; and for the third light-emitting device:

the second one of the emissive sub-layers of the third light-emitting device has a narrower band gap than the first one of the emissive sub-layers of the third light-emitting device;

the third one of the emissive sub-layers of the third light-emitting device has a narrower band gap than the second one of the emissive sub-layers of the third light-emitting device; and the third one of the emissive sub-layers of the third light-emitting device is located closer to the hole transport layer than the first one and second one of the emissive sub-layers of the third light-emitting device.

17. The device of claim 15, wherein:

the electron transport layer is a limiting charge transfer layer having an electron mobility lower than a hole mobility of the hole transport layer;

for the second light-emitting device:

the second one of the emissive sub-layers of the second light-emitting device has a narrower band gap than the first one of the emissive sub-layers of the second light-emitting device; and the second one of the emissive sub-layers of the second light-emitting device is located closer to the electron transport layer than the first one of the emissive sub-layers of the second light-emitting device; and for the third light-emitting device:

the second one of the emissive sub-layers of the third light-emitting device has a narrower band gap than the first one of the emissive sub-layers of the third light-emitting device;

the third one of the emissive sub-layers of the third light-emitting device has a narrower band gap than the second one of the emissive sub-layers of the third light-emitting device; and the third one of the emissive sub-layers of the third light-emitting device is located closer to the electron transport layer than the first one and second one of the emissive sub-layers of the third light-emitting device.

18. The device of claim 11, wherein the charge transport layers are common to the light-emitting devices.

19. The device of claim 11, wherein the cathodes of the respective light-emitting devices are a part of a common cathode that is common to the light-emitting devices.

* * * * *